US009575103B2

(12) United States Patent
Forrest et al.

(10) Patent No.: US 9,575,103 B2
(45) Date of Patent: Feb. 21, 2017

(54) INTEGRATED CIRCUIT AND ASSOCIATED METHODS FOR MEASUREMENT OF AN EXTERNAL IMPEDANCE

(71) Applicant: Allegro Microsystems, LLC, Worcester, MA (US)

(72) Inventors: Glenn A. Forrest, Bow, NH (US); Wei Zhang, Nashua, NH (US)

(73) Assignee: ALLEGRO MICROSYSTEMS, LLC, Worcester, MA (US)

( * ) Notice: Subject to any disclaimer, the term of this patent is extended or adjusted under 35 U.S.C. 154(b) by 358 days.

(21) Appl. No.: 14/291,597

(22) Filed: May 30, 2014

(65) Prior Publication Data

US 2015/0346252 A1  Dec. 3, 2015

(51) Int. Cl.
*G01R 27/08* (2006.01)
*G01R 27/02* (2006.01)
*G01R 31/28* (2006.01)
*G01R 27/20* (2006.01)

(52) U.S. Cl.
CPC ............ *G01R 27/02* (2013.01); *G01R 27/205* (2013.01); *G01R 31/2851* (2013.01); *G01R 31/2853* (2013.01); *G01R 31/2856* (2013.01)

(58) Field of Classification Search
CPC .................................................. G01R 27/205
USPC ............................. 324/750.01, 691, 716, 719
See application file for complete search history.

(56) References Cited

U.S. PATENT DOCUMENTS

| 3,679,916 A | 7/1972 | Siebers | |
|---|---|---|---|
| 2003/0094958 A1* | 5/2003 | Stave | G01R 27/08 324/691 |
| 2004/0041581 A1* | 3/2004 | Saijyo | G01R 3/00 324/754.03 |
| 2006/0097741 A1* | 5/2006 | Payman | G01R 27/205 324/762.03 |
| 2007/0090697 A1 | 4/2007 | Bittner | |
| 2007/0279124 A1* | 12/2007 | Watarai | H04L 25/0276 327/560 |
| 2009/0033324 A1* | 2/2009 | Tomida | G01R 33/07 324/260 |

(Continued)

FOREIGN PATENT DOCUMENTS

| EP | 0 352 734 | 1/1990 |
|---|---|---|
| WO | WO 2007/093172 | 8/2007 |

OTHER PUBLICATIONS

Search Report and Written Opinion dated Aug. 7, 2015 for PCT Application No. PCT/US2015/031902; 13 pages.

*Primary Examiner* — Patrick Assouad
*Assistant Examiner* — Demetrius Pretlow
(74) *Attorney, Agent, or Firm* — Daly, Crowley, Mofford & Durkee, LLP

(57) ABSTRACT

An integrated circuit includes an output circuit having a first terminal adapted to couple to an external power supply, a second terminal adapted to couple to a reference potential, and a third, control terminal. The first and second terminals of the output circuit provide output terminals of the integrated circuit. The integrated circuit further includes an impedance measurement circuit responsive to the external power supply to generate a control signal for coupling to the control terminal of the output circuit. The control signal controls a current level associated with the output circuit. A corresponding method is also described.

20 Claims, 4 Drawing Sheets

(56) References Cited

U.S. PATENT DOCUMENTS

| | | | |
|---|---|---|---|
| 2012/0039005 A1* | 2/2012 | Kanakubo | H02H 3/087 361/59 |
| 2012/0092800 A1* | 4/2012 | Ko | H02H 3/38 361/91.2 |
| 2012/0112829 A1* | 5/2012 | Tanaka | H02M 3/155 327/564 |
| 2013/0027089 A1 | 1/2013 | Huang | |
| 2015/0153405 A1* | 6/2015 | Wu | G01R 31/31919 324/73.1 |
| 2015/0247892 A1* | 9/2015 | Robertazzi | G01R 31/2607 324/414 |

* cited by examiner

INTEGRATED CIRCUIT AND ASSOCIATED METHODS FOR MEASUREMENT OF AN EXTERNAL IMPEDANCE

CROSS REFERENCE TO RELATED APPLICATIONS

Not Applicable.

STATEMENT REGARDING FEDERALLY SPONSORED RESEARCH

Not Applicable.

FIELD

This disclosure relates generally to integrated circuits, and, more particularly, to an integrated circuit and associated methods capable of determining an external impedance associated with the integrated circuit.

BACKGROUND

Electronic circuit design relies heavily on the use of integrated circuits (ICs), circuits in which all components, passive and active, are integrated on a single semiconductor substrate. Integrated circuit performance is affected not only by internal factors, such as tolerances associated with semiconductor fabrication techniques, but is likewise influenced by external factors, such as the impedance associated with external circuits and connections. For example, the impedance, sometimes referred to as "contact resistance", associated with a connection of the integrated circuit to an external device, such as a power supply of Automatic Test Equipment (ATE), can significantly affect the integrated circuit performance. Elevated contact resistance can indicate a complete failure of a particular integrated circuit connection (i.e., a broken lead wire or solder connection) and even less significantly elevated contact resistance can degrade integrated circuit performance. For example, some integrated circuit functions require a minimum supply voltage and a high contact resistance can result in an insufficient supply voltage level at the integrated circuit for certain circuit functionality.

One technique for measuring external impedance in a test environment is a manual process whereby a supply voltage coupled to the integrated circuit is set at a first level while the current and voltage at a particular IC connection is measured, such as with a Kelvin connection. The supply voltage is thereafter set to a second level while the current and voltage at the same connection is measured and the ratio of the difference between the voltages and currents measured at the two supply voltage levels is computed to provide an indication of the contact resistance. However, this technique for measuring external impedance tends to be slow and labor intensive and therefore costly to the overall IC manufacturing process.

SUMMARY

The present disclosure provides an integrated circuit with built-in impedance measurement circuitry and associated methods capable of determining an external impedance associated with the integrated circuit without the use of time and labor intensive techniques or specialized impedance measurement instruments. Furthermore the described circuitry and methods can be used when the integrated circuit is in use in its intended application as opposed to only during the manufacturing and testing process.

In one aspect, an integrated circuit includes an output circuit having a first terminal adapted to couple to an external power supply, a second terminal adapted to couple to a reference potential, and a third, control terminal. The first and second terminals provide output terminals of the integrated circuit. Additionally, the integrated circuit includes an impedance measurement circuit responsive to the external power supply to generate a control signal for coupling to the control terminal of the output circuit. The control signal controls a current level associated with the output circuit.

In one embodiment, the impedance measurement circuit may include a resistor divider coupled between the power supply and the reference potential and a comparator responsive to a voltage associated with the resistor divider, wherein an output signal of the comparator provides the control signal. The impedance measurement circuit may include a logic gate coupled to receive the output signal of the comparator and a test mode signal to provide the control signal. In another embodiment, the impedance measurement circuit may include a resistor divider coupled between the power supply and the reference potential and a voltage associated with the resistor divider may provide the control signal.

Features of the integrated circuit may include one or more of the following. The comparator may have hysteresis. An oscillation of an output signal of the integrated circuit may be indicative of an external impedance associated with the integrated circuit. In particular, a time of occurrence of the oscillation and/or a duration of the oscillation may be indicative of the external impedance. The monitored output signal may be a current provided by the output circuit. The external power supply may provide a supply voltage that is ramped through a predetermined voltage range at a predetermined rate. A transition in the control signal may cause an increase in the current level of the output circuit. The output circuit may include a current source, the integrated circuit may be a magnetic field sensor and/or the external power supply may be associated with an ATE system.

In another aspect, a method for determining an external impedance associated with an integrated circuit includes coupling an external power supply to the integrated circuit, the integrated circuit having an output circuit with a first terminal adapted to couple to the external power supply, a second terminal adapted to couple to a reference potential, and a third, control terminal. The first and second terminals provide output terminals of the integrated circuit. A control signal for coupling to the control terminal of the output circuit is generated in response to a supply voltage from the external power supply. The method also includes ramping the supply voltage of the external power supply through a predetermined range of voltages and controlling a current level associated with the output circuit in response to the control signal. An output signal of the integrated circuit is monitored for an oscillation and the external impedance is determined in response to the oscillation.

Generating the control signal may include level shifting the supply voltage and/or comparing a level shifted version of the supply voltage to a threshold voltage. In an embodiment, the output circuit includes a current source and monitoring the output signal for an oscillation includes monitoring a current level of the current source. The external impedance may be determined in response to a time of occurrence of the oscillation, a duration of the oscillation, or both.

BRIEF DESCRIPTION OF THE DRAWINGS

The foregoing features of the disclosure, as well as the disclosure itself may be more carefully understood from the following detailed description of the drawings, which.

DETAILED DESCRIPTION

The features and other details of the disclosure will now be more particularly described. It will be understood that the specific embodiments described herein are shown by way of illustration and not as limitations of the broad concepts sought to be protected herein.

For convenience, certain introductory concepts and terms used in the specification are collected here.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "magnetic field sensing element" is used to describe a variety of electronic elements that can sense a magnetic field. The magnetic field sensing element can be, but is not limited to, a Hall effect element, a magnetoresistance element, or a magnetoresistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type II-V semiconductor material like Gallium-Arsenide (GaAs) or an Indium compound, e.g., Indium-Antimonide (nSb).

Figure 1:
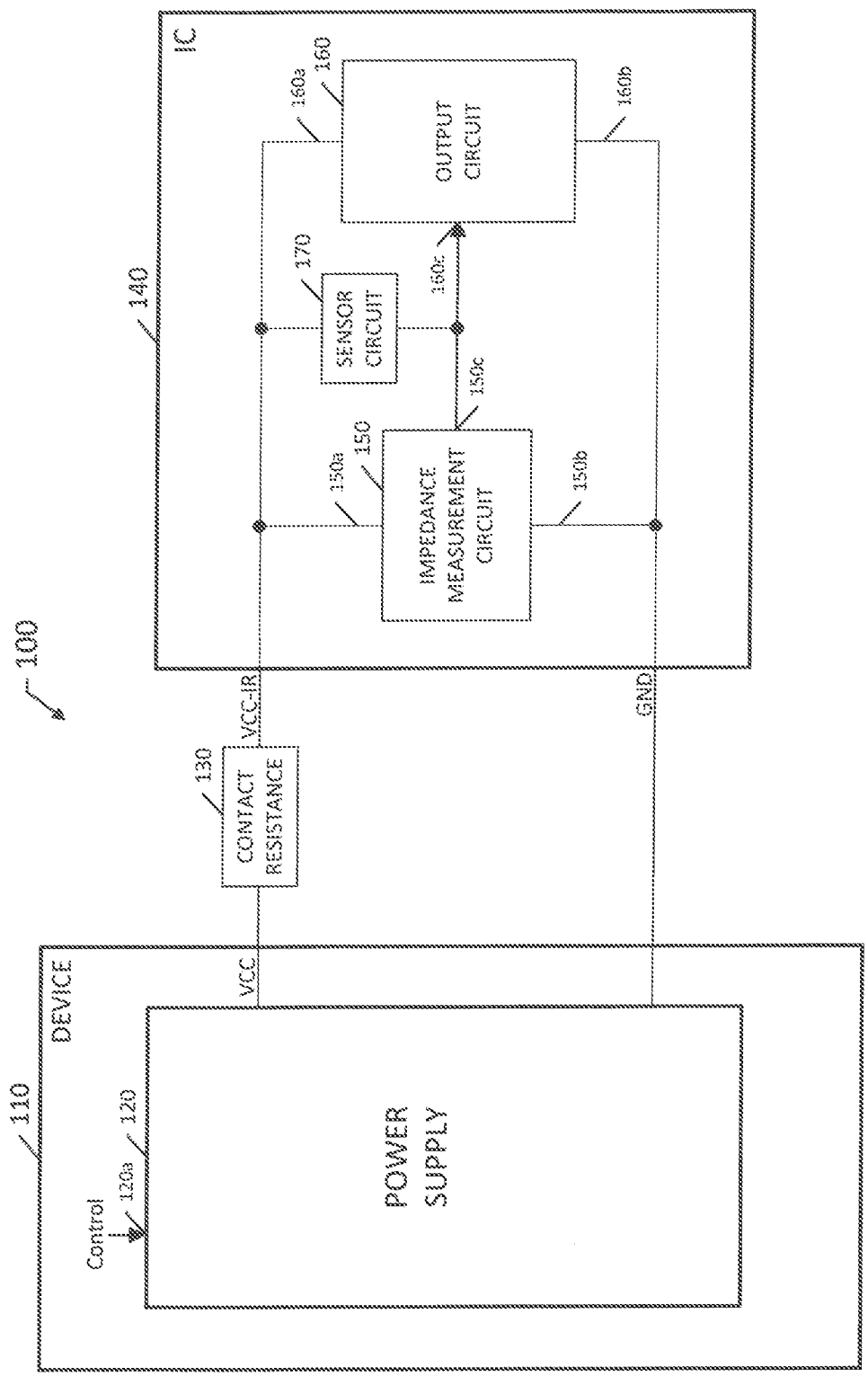
FIG. 1 is a block diagram of an exemplary integrated circuit having an impedance measurement circuit and an output circuit coupled to a device having a power supply.

Referring now to FIG. 1, an exemplary integrated circuit 140 capable of measuring an external impedance (also sometimes referred to herein as "contact resistance") associated with the integrated circuit 140 is shown. The system 100 includes integrated circuit 140 adapted to couple to a device 110 having a power supply 120. More particularly, the integrated circuit 140 includes an output circuit 160 having a first terminal 160a adapted to couple to the power supply 120, a second terminal 160b adapted to couple to a reference potential (e.g., GND), and a third, control terminal 160c. The integrated circuit 140 additionally includes an impedance measurement circuit 150 having a first terminal 150a adapted to couple to the power supply 120, a second terminal 150b adapted to couple to the reference potential, and a third terminal 150c adapted to couple to the control terminal 160c of the output circuit. The impedance measurement circuit 150 generates a control signal for coupling to the output circuit 160 to control a current level associated with the output circuit as will be explained.

The integrated circuit 140 and the device 110 are shown as coupled to a contact resistance 130. The contact resistance 130 is, generally, representative of resistance(s) existing between and associated with the integrated circuit 140 and/or the device 110 and their interconnections. More particularly, the contact resistance 130 represents resistance associated with electrical leads of the integrated circuit 140 and/or the device 110, resistance associated with conductive traces on a circuit board associated with the device 110 and/or on the integrated circuit, and other interconnects associated with the integrated circuit 140 and/or the device 110 (such as solder connections, wire, cabling, or other conductor connections), and the like.

The device 110 may, for example, be an Automatic Test Equipment (ATE) system, with the power supply 120 being representative of a power supply associated with the ATE system. The power supply 120 is capable of ramping a supply voltage (VCC) provided by the power supply 120 through a predetermined range of voltages at a predetermined rate and may do so under the control of a control signal provided at a control terminal 120a. The supply voltage received by the integrated circuit 140 is represented as VCC-IR, which is representative of the supply voltage (VCC) less a voltage drop (IR) resulting from the contact resistance 130.

The integrated circuit 140 may take any form of circuit which would benefit from on-chip contact resistance characterization. For example, the integrated circuit 140 can be a digital integrated circuit (e.g., microprocessor), linear integrated circuit, or a mixed-signal integrated circuit and representative of a device under test (DUT). The integrated circuit 140 can, for example, be coupled to the device 110 (e.g., ATE system) through a load (or interface) board, which may also contribute to the contact resistance 130.

In some embodiments, the integrated circuit 140 is a sensor integrated circuit containing sensor circuitry 170; however, it will be appreciated that the circuitry 170 more generally represents the integrated circuit functionality. As one example, the integrated circuit 140 may be a magnetic field sensor integrated circuit that contains one or more magnetic field sensing elements as part of the sensor circuitry 170 and that provides an output signal indicative of a magnetic field. Such a magnetic field sensor integrated circuit may be a linear sensor in which case the output circuit 160 may provide an output signal, such as in the form of a current, which is proportional to a sensed magnetic field. Alternatively, such a magnetic field sensor integrated circuit may operate as a binary switch to provide an output signal at one of two levels depending on whether the sensed magnetic field is greater or less than a particular threshold.

Figure 2:
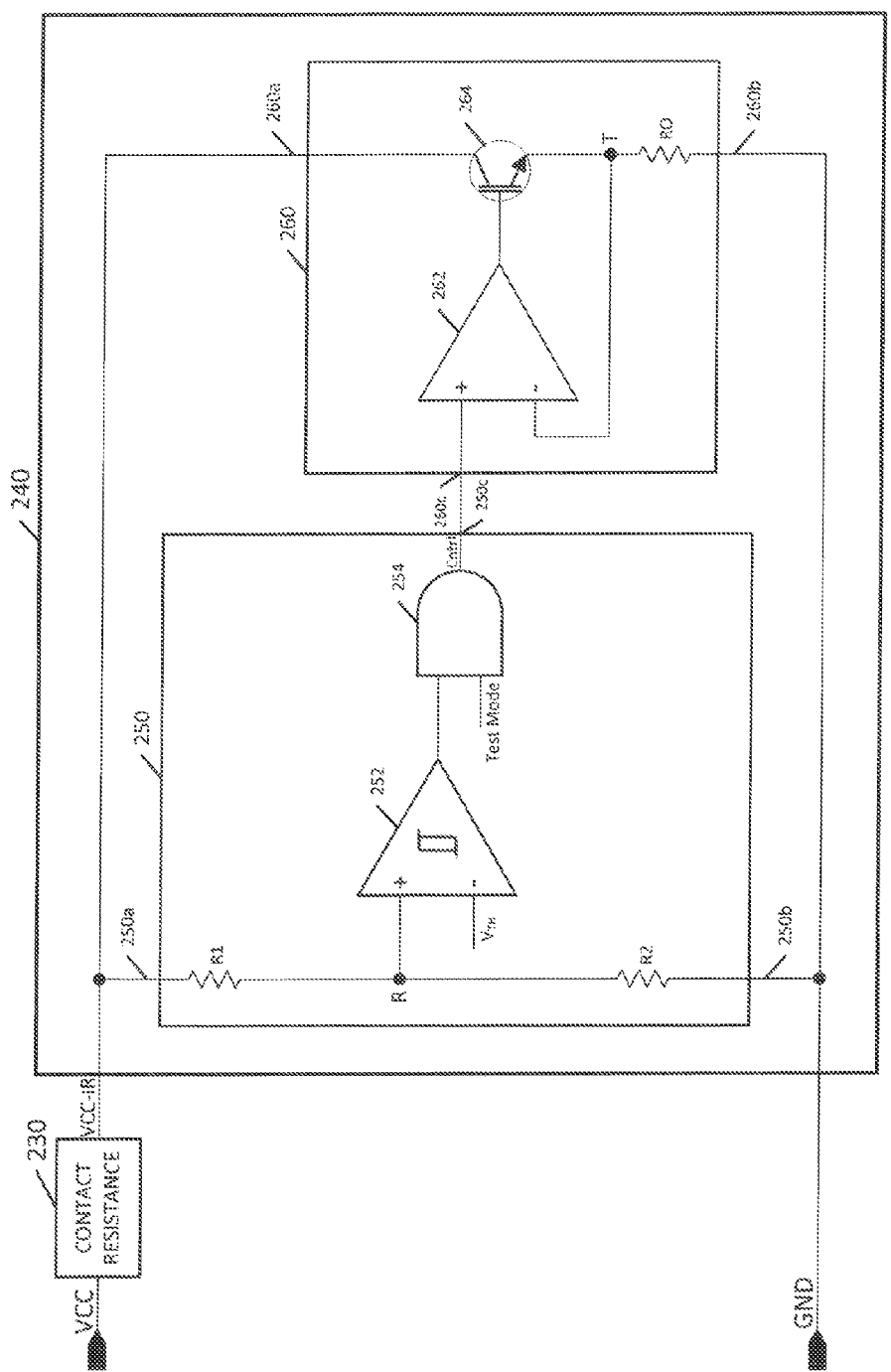
FIG. 2 is a block diagram of a more detailed embodiment of the integrated circuit of FIG. 1.

Referring now to FIG. 2, an integrated circuit 240, which can be the same as or similar to the integrated circuit 140 described above in conjunction with FIG. 1, is shown coupled to a contact resistance 230, which can be the same as or similar to contact resistance 130 of FIG. 1, and thus, which is representative of resistance(s) between and associated with the integrated circuit 240 and an external power supply (not shown). The external power supply (not shown) may be the same as or similar to the power supply 120 of device 110 shown in FIG. 1. As discussed above in conjunction with FIG. 1, the power supply 120 may, for example, be a power supply of an ATE system. The integrated circuit 240, like the integrated circuit 140 of FIG. 1, can be any type of integrated circuit that would benefit from external impedance characterization. Although not shown for simplicity of illustration, the integrated circuit 240 contains circuitry, which may be the same as or similar to the sensor circuitry 170 of FIG. 1, which represents functionality of the integrated circuit.

The integrated circuit 240 includes an impedance measurement circuit 250 having a resistor divider, as indicated by R1 and R2, a comparator 252, and a logic gate 254. The resistor divider is coupled between a first terminal 250a and a second terminal 250b of the impedance measurement circuit 250. The first impedance measurement terminal 250a is adapted to couple to the external power supply (not shown), and the second impedance measurement terminal 250b is adapted to couple to a reference potential (GND). The voltage at node R is proportional to the voltage VCC-IR. The value of resistors R1 and R2 and the ratio of the values of resistors R1 and R2 can, for example, be chosen based on a voltage level associated with the supply voltage (VCC) and/or the predetermined range of voltages of the supply voltage (VCC) and/or a threshold voltage level $V_{TH}$.

The comparator 252 is coupled to receive a voltage associated with the resistor divider (e.g., a voltage potential at node R) at a first comparator input and the threshold voltage (Vn) at a second comparator input and is configured to generate a comparison signal in response to the first comparator input and the second comparator input. The threshold voltage ($V_{TH}$) can be selected based on various factors, such as available voltage levels on the integrated circuit, the external supply voltage level (VCC), and/or the level shifting by the resistor divider. The threshold voltage ($V_{TH}$) can be a fixed voltage, as may be available on the integrated circuit 240 and as may be level shifted by the resistor divider.

The comparator 252 has hysteresis that is selected based on the minimum contact resistance to be detected, as will be explained below. While various different factors may be considered in selecting the resistor divider, the threshold voltage $V_{TH}$, and the comparator hysteresis, all of these choices are considered together in order to cause a Cntrl signal (provided by the impedance measurement circuit 250) to transition when the VCC-IR voltage falls below a predetermined level indicative of a contact resistance level equal to or greater than a predetermined contact resistance level to be detected for a given supply voltage level (VCC).

The comparator 252 is coupled to a logic gate 254 that receives the comparison signal at a first logic gate input and a test mode signal (Test Mode) at a second logic gate input and is configured to generate a logic gate output signal (Cntrl) at a third terminal 250c of the impedance measurement circuit 250 in response to the first logic gate input and the second logic gate input. The test mode signal (Test Mode) can, for example, initiate a test mode operation. In test mode operation, for example, the integrated circuit 240 is configured to measure an external impedance. In contrast, in "normal operation", the integrated circuit 240 is configured to perform its intended function(s) via circuitry, such as circuitry 170 in FIG. 1 (e.g., magnetic field sensing). In some embodiments, the logic gate 254 is an AND gate.

The integrated circuit 240 also includes an output circuit 260 having an operational amplifier 262, a transistor 264 and a resistor RO and an associated current level. In some embodiments, the output circuit 260 is provided in the form of a current source and the associated current level is the level of the current that the current source sinks. The output circuit 260 has a first terminal 260a adapted to couple to an external power supply (not shown), a second terminal 260b adapted to couple to a reference potential, and a third, control terminal 260c adapted to couple to the third terminal 250c of the impedance measurement circuit 250 at which the logic gate output signal is provided and which, in the illustrated embodiment, provides the control signal (Cntrl) to the output circuit 260. The first and second terminals 260a, 260b of the output circuit provide output terminals of the integrated circuit 240. In embodiments in which the output circuit 260 is a current source, the integrated circuit output is a current provided by the current source between terminals 260a, 260b.

In particular, the operational amplifier 262 is coupled to receive the control signal (Cntrl) from the third terminal 250c of the impedance measurement circuit 250 at its non-inverting input and provides an output signal to a control terminal of transistor 264. Here the transistor is an bipolar npn device having a first terminal (e.g., collector terminal) adapted to couple to the first terminal 260a of the output circuit 260, a second terminal (e.g., emitter terminal) adapted to couple to the inverting input of the operational amplifier 262 and to the resistor RO, and a third terminal (e.g., base terminal) adapted to couple to the operational amplifier output.

In one alternate embodiment of the impedance measurement circuit 250, the comparison signal at the output of the comparator provides the control signal (Cntrl) to the third, control terminal 260c of the output circuit and the logic gate 254 is eliminated. In another alternate embodiment, which can be representative of an analog implementation of impedance measurement circuit 250, a voltage associated with the resistor divider (e.g., at node R) of the impedance measurement circuit 250 provides the control signal (Cntrl) to the third, control terminal 260c of the output circuit 260 and the comparator 252 is eliminated.

In operation, the external power supply (not shown) is configured to ramp the supply voltage (VCC) through a predetermined range of voltages. In some embodiments, the supply voltage is ramped from a first voltage of the predetermined range of voltages to a second lower voltage of the predetermined range of voltages. In other embodiments, the first voltage is lower than the second voltage. The predetermined range of voltages can, for example, be selected based on the specified supply voltage range of the integrated circuit 240. The resistor divider can be selected or modified to account for the specified supply voltage range of the integrated circuit 240.

The comparator 252 receives the voltage associated with the resistor divider (e.g., the voltage at node R) at a first comparator input (e.g., non-inverting input) and the threshold voltage ($V_{TH}$) at a second comparator input (e.g., inverting input) and compares the voltage associated with the resistor divider to the threshold voltage ($V_{TH}$). In the embodiment shown in FIG. 2, when the voltage at node R is greater than the threshold voltage ($V_{TH}$), the comparator 252 output (the comparison signal) is at a logic high level and when the voltage at node R is less than the threshold voltage ($V_{TH}$), the comparator 252 output (the comparison signal) is at a logic low level.

The logic gate 254 receives the comparison signal and the test mode signal (Test Mode) and produces a logic gate output signal (Cntrl) according to the logic levels of the input signals. The Test Mode signal gates the impedance measurement function by keeping the Cntrl signal low unless the Test Mode signal is asserted, thereby initiating impedance measurement. For example, a logic gate output signal of "1", for example, is representative of the voltage associated with the resistor divider being greater than the threshold voltage ($V_{TH}$) and the Test Mode signal being asserted. In contrast, a logic gate output signal of "0", for example, is representative of the voltage associated with the Test Mode signal being de-asserted, regardless of the relative level of the voltage at node R and the threshold voltage $V_{TH}$. It is to be appreciated that the Test Mode signal may be active high or low.

The operational amplifier 262 receives the control signal at the first amplifier input (e.g., non-inverting input) and a feedback signal at the second amplifier input (e.g., inverting input). The operational amplifier 262, in conjunction with the three terminal device 264 and the resistor RO, controls a current level associated with the output circuit 260 (here, the amount of current that the voltage controlled current source 260 sinks) in response to the control signal Cntrl. In one embodiment, when the Cntrl signal goes high (i.e., the Test Mode signal is asserted and the voltage at node R is greater than the threshold voltage $V_{TH}$), the output of the operational amplifier 262 increases, thereby increasing the current through the output circuit 260 (i.e., through transistor 264). In other embodiments, a transition in the control signal causes a decrease in the current level associated with the output circuit 260.

As discussed above, an output signal is produced at output terminals of the integrated circuit 240, which are the first output terminal 260a and the second output terminal 260b of the output circuit 260. The output signal, in particular, is monitored for an oscillation. Depending on the contact resistance level, the increase in the level of current of the output circuit that occurs upon the transition of the comparison signal may cause the voltage at node R to decrease, thereby causing the output of the comparator 252 to transition to a logic low level (if the resulting voltage drop across the contact resistance is sufficient to overcome the comparator hysteresis), the output of the operational amplifier 262 to decrease, and the transistor 264 to cease conduction, thereby causing the output current to decrease. The falling output current may in turn cause the voltage at node R to increase, thereby causing the output of the comparator to transition again to a logic high level (if the resulting voltage increase across the contact resistance is sufficient to overcome the comparator hysteresis), the output of the operational amplifier to increase, and the transistor 264 to conduct again so that the output current increases. As will thus be apparent, operation of the output circuit in this manner causes an oscillation in the output current of the integrated circuit 240 when the voltage change across the contact resistance due to the increased or decreased output current is large enough to overcome the hysteresis of the comparator 252. Stated differently, no oscillation will occur unless the product of the contact resistance and the output current increase/decrease is greater than the comparator hysteresis level.

In particular, an output signal of the integrated circuit 240 is monitored for an oscillation and the external impedance 230 associated with the integrated circuit 240 may be determined in response to the oscillation. In some embodiments, monitoring the output signal of the integrated circuit 240 for an oscillation includes monitoring the current level of the current source 260, as can be achieved either as part of the integrated circuit 240 with a current monitoring circuit or external to the integrated circuit 240, such as at the external device (e.g., device 110 in FIG. 1). As one example, the current monitoring circuit (not shown) may include a series resistor (e.g., 100 ohm resistor) coupled between an integrated circuit reference potential and an external reference potential and the current level of the current source 260 can be determined by monitoring the voltage across the serial resistor.

An illustrative process for characterizing the external impedance based on IC output signal oscillation is discussed below in connection with FIG. 3. However, suffice it here to say that the result of the characterization may be an indication that the external impedance 230 is above or below a predetermined level and/or may be an indication that the external impedance is within a predetermined range of impedances. As examples, the integrated circuit 240 may provide an indicator of the external impedance level, such as the form of an LED or other visual indicator, or a signal having a level indicative of the external impedance level. The impedance indicator signal may be stored in a memory device (e.g., EEPROM) and the impedance may be conveyed in various formats and/or protocols. As one example, the impedance may be conveyed in the form of a pulse width of the indicator signal. Furthermore, such indicator(s) may be provided to various circuitry on the integrated circuit 240 that may respond to the external impedance indication by taking various actions. As one example, some integrated circuits employ fuses that are blown during manufacture for various purposes, such as trimming certain parameters such as sensitivity or offset or altering configurations or signal protocols. In this example, the fuses may not be capable of being reliably blown unless the voltage at the chip (VCC-IR) is greater than or equal to a predetermined level. Accordingly, an indicator that the external impedance 230 is greater than a predetermined level may be coupled to a lock-out circuit that prevents the fuse blowing operation from occurring if/while the indication is of an external impedance greater than the predetermined level.

Figure 3:
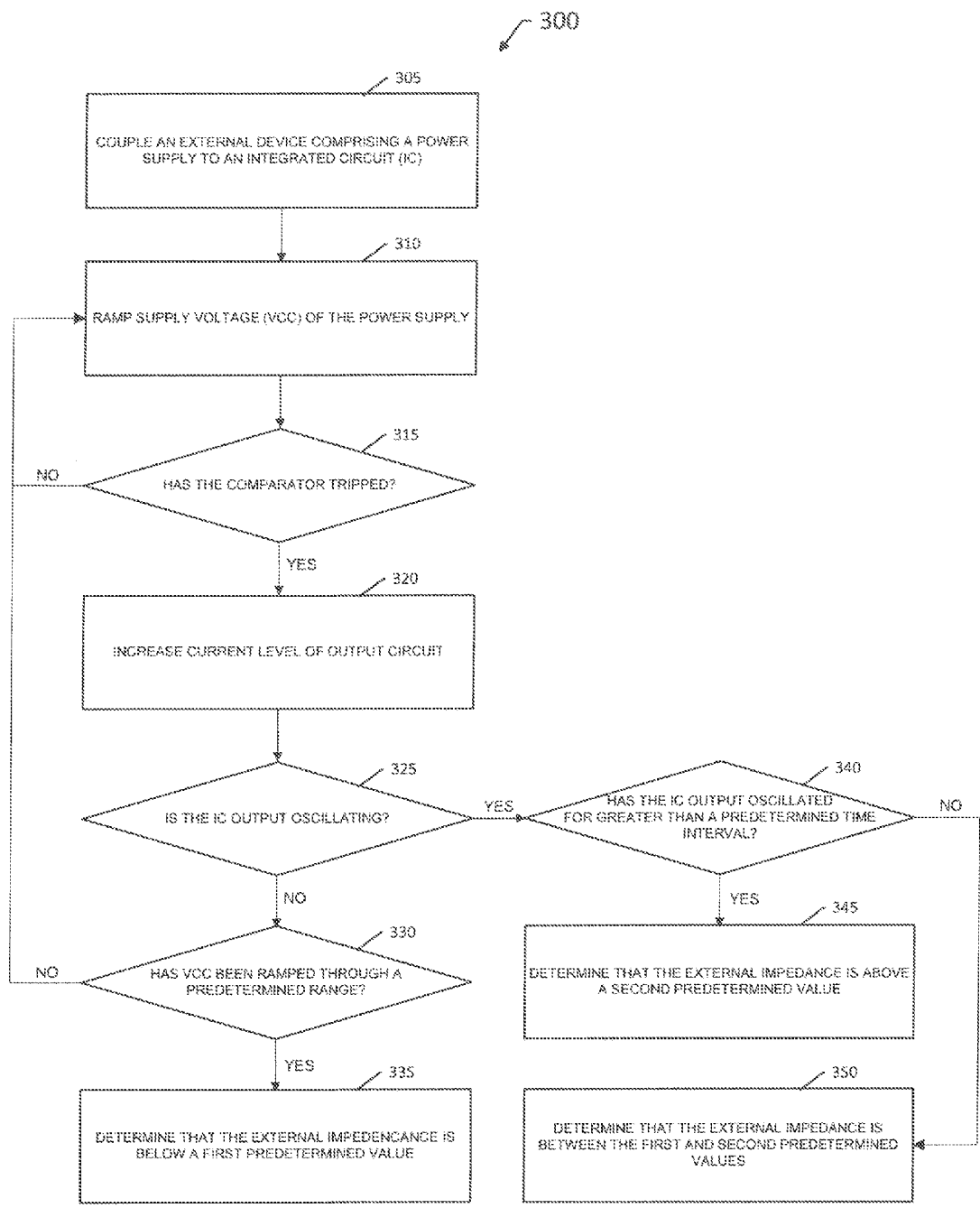
FIG. 3 is a flowchart illustrating a method for determining an external impedance associated with an integrated circuit that may be applied to the integrated circuit of FIG. 2.

Referring now to FIG. 3, shown is a flowchart corresponding to a method 300 for determining an external impedance associated with an integrated circuit that can be implemented in integrated circuit 240 shown in FIG. 2. Integrated circuit 240, as discussed above, can be a magnetic field sensor. Rectangular elements (typified by element 305 in FIG. 3), herein denoted "processing blocks," represent computer software instructions or groups of instructions. Diamond shaped elements (typified by element 315 in FIG. 3), herein denoted "decision blocks," represent computer software instructions, or groups of instructions, which affect the execution of the computer software instructions represented by the processing blocks.

The processing and decision blocks can represent steps performed by functionally equivalent circuits such as a digital signal processor circuit or an application specific integrated circuit (ASIC). The flow diagram does not depict the syntax of any particular programming language. Rather, the flow diagram illustrates the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated, the blocks described below are unordered; meaning that, when possible, the steps can be performed in any convenient or desirable order.

As illustrated in FIG. 3, a method 300 for determining an external impedance associated with an integrated circuit (e.g., external impedance 230 associated with integrated circuit 240, shown in FIG. 2) begins at block 305 where an external device comprising a power supply, which can be the same as or similar to device 110 of FIG. 1, is coupled to an integrated circuit, which can be the same as or similar to integrated circuit 240 of FIG. 2.

At block 310, a supply voltage (VCC) of the external power supply (e.g., 120, shown in FIG. 1) is ramped through a predetermined range of voltages. In some embodiments, the supply voltage (VCC) is ramped through the predetermined range of voltages at a predetermined rate.

At block 315, the integrated circuit (e.g., 240, shown in FIG. 2) determines whether the comparator (e.g., comparator 252, shown in FIG. 2) has tripped. The comparator can trip, for example, when a voltage associated with the resistor divider (e.g., a voltage potential at node R) becomes greater than the threshold voltage (V-m). If the comparator has tripped, the method proceeds to a block 320, where a current level associated with the output circuit (e.g., 260, shown in FIG. 2) is increased in response to a control signal. In some embodiments, a transition in the control signal (e.g., the logic gate output signal Cntrl in FIG. 2) causes the increase in the current level. Alternatively, if the comparator has not yet tripped, the method returns to a block 310, where the supply voltage (VCC) of the power supply (e.g., 120, shown in FIG. 1) continues to be ramped through the predetermined range of voltages. The number of times block 310 is repeated depends, at least in part, on a number of voltage levels associated with the predetermined range of voltages.

In an alternate embodiment, specifically where the integrated circuit (e.g., 240, shown in FIG. 2) does not include a comparator (e.g., 252, shown in FIG. 2), after a block 310 the method proceeds to a block 320 to increase the output circuit current level, such as may occur after a predetermined delay.

Figure 4:
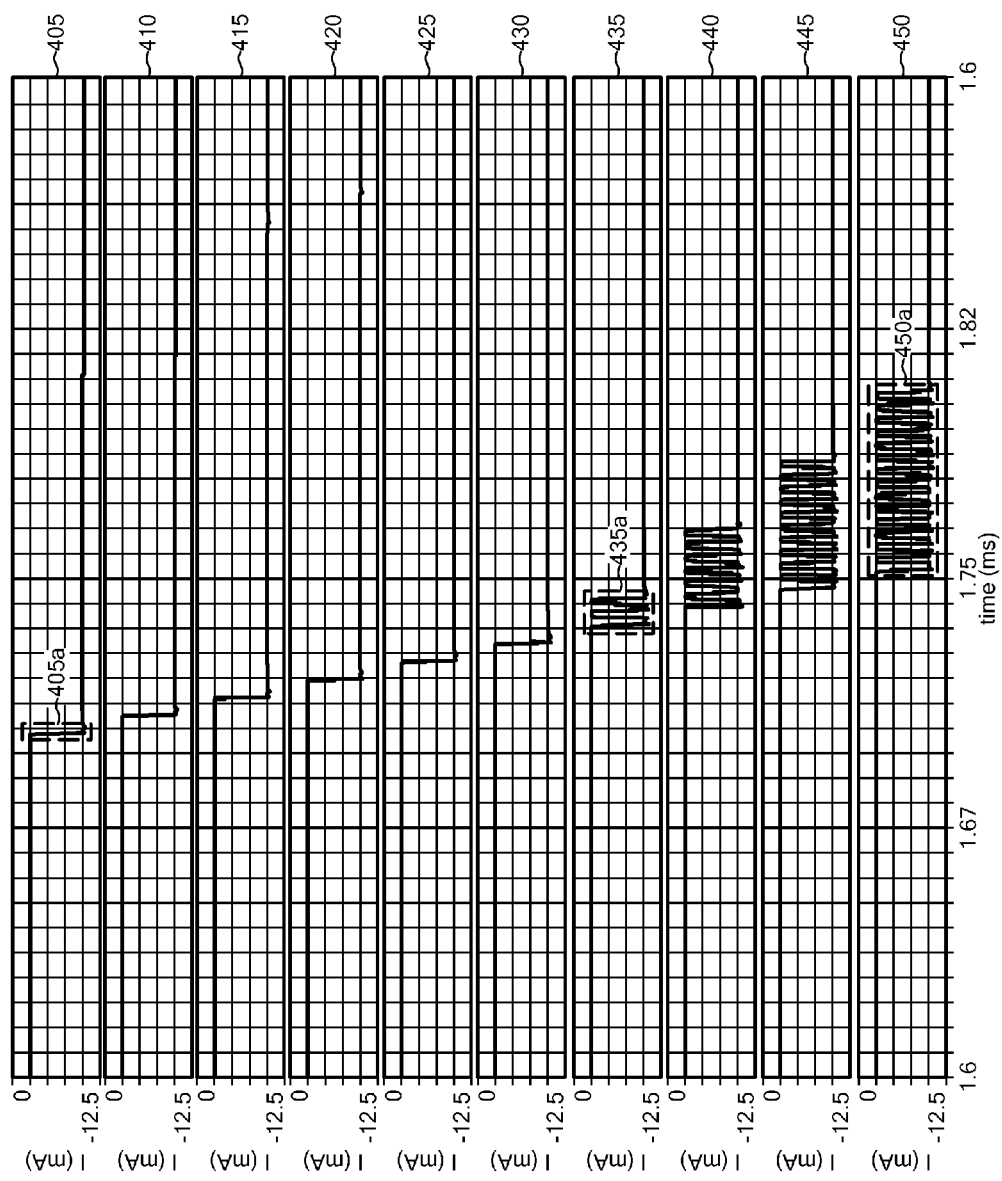
FIG. 4 is a plurality of graphs showing example output signals of the integrated circuit of FIG. 2.

Subsequent to the current level being increased in block 320, the method proceeds to a block 325, where an output signal of the integrated circuit (e.g., the current through transistor 264, shown in FIG. 2) is monitored for oscillation. Illustrative output signals are shown in FIG. 4 and described below. If it is determined that the output signal (e.g., 450a, shown in FIG. 4) is oscillating, the method proceeds to a block 340. Alternatively, if it is determined that the output signal (e.g., 405a, shown in FIG. 4) is not oscillating, the method proceeds to a block 330.

At block 330, it is determined whether the supply voltage (VCC) has been ramped through the predetermined range. If the supply voltage (VCC) has been ramped through the predetermined range, the method proceeds to a block 335 where it is determined that the external impedance is below a first predetermined value. Alternatively, if it is determined that the supply voltage (VCC) has not been ramped through the predetermined range, the method returns to a block 310 where the supply voltage (VCC) continues to be ramped through the predetermined range of voltages. As noted above, the number of times block 310 is repeated depends, at least in part, on the number of voltages associated with the predetermined range of voltages.

At block 340, it is determined whether the output signal (e.g., 450a, shown in FIG. 4) of the integrated circuit (e.g., 240, shown in FIG. 2) has oscillated for greater than a predetermined 15 s time interval. If the output signal of the integrated circuit has oscillated for greater than the predetermined time interval, the method proceeds to a block 345 where it is determined that the external impedance is above a second predetermined value. Alternatively, if it is determined that the output signal (e.g., 435a, shown in FIG. 4) of the integrated circuit has not oscillated for greater than the predetermined time interval, the method proceeds to a block 350 where it is determined that the external impedance is between the first and second predetermined values. It will be appreciated that the duration of oscillation is a function of the rate of change (i.e., rate of ramping) of the VCC voltage, the comparator hysteresis, the increase/decrease in the current through transistor 264 (FIG. 2), and the contact resistance. In general, the IC output will oscillate for as long as it takes the VCC voltage to ramp from a first level at which VCC-IR (based on the lower output current level) shifted down by the resistor divider R1, R2 reaches the comparator threshold voltage $V_{TH}$ to a second level at which VCC-IR (based on the higher output current level) shifted down by the resistor divider R1, R2 reaches the comparator threshold voltage $V_{TH}$ minus the comparator hysteresis. The larger the contact resistance, the larger the VCC range that will cause oscillation and therefore the longer the duration of oscillation as VCC is ramped. In some embodiments, determining the external impedance comprises determining the external impedance in response to a time of occurrence of the oscillation of the output signal, a duration of the oscillation of the output signal, or both.

Referring now to FIG. 4, a plurality of graphs (405, 410, 415, 420, 425, 430, 435, 440, 445, 450) have a horizontal axis with a scale in time units of milliseconds (ms) and a vertical axis with a scale in current amplitude (peak-to-peak) units of milliamps (mA). The vertical axis is representative of output signal levels from an integrated circuit, which can be the same as or similar to integrated circuit 240 shown in FIG. 2. Each of the plurality of graphs (405, 410, 415, 420, 425, 430, 435, 440, 445, 450) shows an output signal representative of an example output signal (e.g., a current signal through the output circuit 260 of FIG. 2) of the integrated circuit monitored at a block 325 of method 300 shown in FIG. 3, for example, each for a different value of contact resistance 230, but over the same range of supply voltages (VCC) ramped at the same rate. In other words, the horizontal axis, while labeled as time units of milliseconds, corresponds to increasing or decreasing supply voltage (VCC). Here, each graph 405-450 is associated with increased contact resistance values such that graph 405 is associated with the lowest contact resistance level and graph 450 is associated with the highest contact resistance level.

It is apparent that the output signal of comparator 252 transitions at a later time (i.e., at a greater VCC voltage) for higher contact resistance as is expected. In other words, the greater the contact resistance, the higher the supply voltage level (VCC) necessary to trip the comparator 252 (FIG. 2), since the greater the voltage drop across the contact resistance. Thus, graph 405 associated with a first lowest contact resistance illustrates the comparator being tripped at a first supply voltage level; whereas graph 430 for example associated with a second, higher contact resistance illustrates the comparator being tripped at a higher supply voltage level (occurring later in the ramping of the supply voltage through the predetermined range).

In particular, the output signals shown in graphs 405, 410, 415, 420, 425, and 430 are representative of output signals monitored by the integrated circuit and determined not to be oscillating (e.g., at a block 325 of method 300). With an output signal substantially the same as or similar to output signal 405*a* shown in graph 405, for example, once the comparator trips and the output current is increased (as labeled at 405*a*), it is determined that the integrated circuit output is not oscillating (see, e.g., block 325 of FIG. 3), following which the external impedance is determined to be below a first predetermined value (e.g., block 335 of FIG. 3) after VCC is ramped through the full range of voltages.

In contrast, the output signals shown in graphs 435, 440, 445, and 450 are representative of output signals monitored by the integrated circuit and determined to be oscillating (e.g., at a block 325 of method 300). With an output signal substantially the same as or similar to output signal shown in graph 450, for example, once the comparator trips (as labeled at 450*a*), it is determined that the integrated circuit output is oscillating (see e.g., block 325 of FIG. 3). Thereafter, it is determined that the oscillation has occurred for more than a predetermined time interval (e.g., block 340 of FIG. 3), following which it is determined that the impedance is above a second predetermined value.

With an output signal substantially the same as or similar to output signal shown in graph 435, for example, once the comparator trips (as labeled at 435*a*), and the oscillation is detected (e.g., block 325 of FIG. 3), it is determined that the oscillation has not occurred for greater than the predetermined time interval (e.g., block 340 of FIG. 3), following which it is determined in block 350 that the impedance is between the first and second predetermined values.

As will be appreciated, if the supply voltage (VCC) is ramped too fast, then it may not be possible to detect an oscillation in the output signal depending on the output signal monitoring circuitry. As a result, the rate at which the supply voltage (VCC) is ramped is selected to be slow enough to enable oscillation detection, but fast enough not to require more time than necessary to perform the impedance measurement.

As described above and will be appreciated by one of skill in the art, embodiments of the disclosure herein may be configured as a system, method, or combination thereof. Accordingly, embodiments of the present disclosure may be comprised of various means including entirely of hardware, entirely of software, or any combination of hardware and software. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

Having described preferred embodiments, which serve to illustrate various concepts, structures and techniques, which are the subject of this patent, it will now become apparent to those of ordinary skill in the art that other embodiments incorporating these concepts, structures and techniques may be used.

It will be appreciated that while the described circuits and methods are particularly well-suited to the illustrated two-wire integrated circuit (i.e., since the impedance measurement utilizes the already existing current source output circuit), the impedance measurement circuits and methods described herein are likewise applicable and advantageous for use in other IC configurations.

Accordingly, it is submitted that that scope of the patent should not be limited to the described embodiments but rather should be limited only by the spirit and scope of the following claims.

What is claimed is:

1. An integrated circuit comprising:
    an output circuit having a first terminal adapted to couple to an external power supply, a second terminal adapted to couple to a reference potential, and a third, control terminal, wherein the first and second terminals provide output terminals of the integrated circuit; and
    an impedance measurement circuit responsive to the external power supply to generate a control signal for coupling to the control terminal of the output circuit and to monitor an output signal of the integrated circuit for an oscillation, wherein the control signal controls a current level associated with the output circuit, and wherein the oscillation of the output signal is indicative of an external impedance associated with the integrated circuit.

2. The integrated circuit of claim 1, wherein the impedance measurement circuit comprises a resistor divider coupled between the power supply and the reference potential and a comparator responsive to a voltage associated with the resistor divider, wherein an output signal of the comparator provides the control signal.

3. The integrated circuit of claim 1, wherein the impedance measurement circuit comprises a resistor divider coupled between the power supply and the reference potential, wherein a voltage associated with the resistor divider provides the control signal.

4. The integrated circuit of claim 2, wherein the comparator has hysteresis.

5. The integrated circuit of claim 1, wherein the output signal is a current provided by the output circuit at the output terminals of the integrated circuit.

6. The integrated circuit of claim 1, wherein a time of occurrence of the oscillation is indicative of the external impedance.

7. The integrated circuit of claim 1, wherein a duration of the oscillation is indicative of the external impedance.

8. The integrated circuit of claim 1, wherein the external power supply provides a supply voltage that is ramped through a predetermined voltage range at a predetermined rate.

9. The integrated circuit of claim 1, wherein a transition in the control signal causes an increase in the current level of the output circuit.

10. The integrated circuit of claim 2, wherein the impedance measurement circuit further comprises a logic gate coupled to receive the output signal of the comparator as a first input and a test mode signal as a second input, wherein an output signal of the logic gate provides the control signal.

11. The integrated circuit of claim 1, wherein the output circuit comprises a current source.

12. The integrated circuit of claim 1, wherein the integrated circuit is a magnetic field sensor.

13. The integrated circuit of claim 1, wherein the external power supply is a power supply associated with Automatic Test Equipment (ATE).

14. A method for determining an external impedance associated with an integrated circuit, said method comprising:
    coupling an external power supply to the integrated circuit, comprising an output circuit having a first terminal adapted to couple to the external power supply, a second terminal adapted to couple to a reference potential, and a third, control terminal, wherein the first and second terminals provide output terminals of the integrated circuit;

generating a control signal for coupling to the control terminal of the output circuit in response to a supply voltage from the external power supply;

ramping the supply voltage of the external power supply through a predetermined range of voltages;

controlling a current level associated with the output circuit in response to the control signal;

monitoring an output signal of the integrated circuit for an oscillation; and determining the external impedance in response to the oscillation.

15. The method of claim 14, wherein generating the control signal comprises comparing a level shifted version of the supply voltage to a threshold voltage.

16. The method of claim 14, wherein generating the control signal comprises level shifting the supply voltage.

17. The method of claim 14, wherein the output circuit comprises a current source and monitoring the output signal of the integrated circuit for an oscillation comprises monitoring a current level of the current source.

18. The method of claim 14 wherein determining the external impedance comprises determining the external impedance in response to a time of occurrence of the oscillation, a duration of the oscillation, or both.

19. The method of claim 14, wherein the integrated circuit is a magnetic field sensor.

20. The method of claim 14, wherein the external power supply is a power supply associated with Automatic Test Equipment (ATE).

* * * * *

UNITED STATES PATENT AND TRADEMARK OFFICE
CERTIFICATE OF CORRECTION

PATENT NO. : 9,575,103 B2  
APPLICATION NO. : 14/291597  
DATED : February 21, 2017  
INVENTOR(S) : Glenn A. Forrest et al.

Page 1 of 1

It is certified that error appears in the above-identified patent and that said Letters Patent is hereby corrected as shown below:

In the Specification

Column 6, Line 29 delete "is an" and replace with --is a--.

In the Claims

Column 12, Line 3 delete "that that" and replace with --that the--.

Signed and Sealed this
Twenty-third Day of January, 2018

Joseph Matal
*Performing the Functions and Duties of the*
*Under Secretary of Commerce for Intellectual Property and*
*Director of the United States Patent and Trademark Office*